United States Patent
Sasatani et al.

(10) Patent No.: US 6,705,912 B2
(45) Date of Patent: Mar. 16, 2004

(54) DISPLAY DEVICE MANUFACTURING METHOD

(75) Inventors: Toru Sasatani, Motosu-Gun (JP); Tetsuji Omura, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/378,079

(22) Filed: Mar. 4, 2003

(65) Prior Publication Data
US 2003/0176137 A1 Sep. 18, 2003

(30) Foreign Application Priority Data
Mar. 4, 2002 (JP) ........................... 2002-057010

(51) Int. Cl.$^7$ .................................................. H01J 1/62
(52) U.S. Cl. ............................................. 445/24; 445/25
(58) Field of Search ..................... 445/24, 25; 313/503, 313/504

(56) References Cited

U.S. PATENT DOCUMENTS 6,307,317 B1 * 10/2001 Codama et al. ............. 313/504

* cited by examiner

*Primary Examiner*—David H. Vu
(74) *Attorney, Agent, or Firm*—Morrison & Foerster LLP

(57) ABSTRACT

A display device manufacturing method includes providing a device substrate having a display element, providing a sealing substrate, and forming a layer of a sealing resin on the sealing substrate. The viscosity of the sealing resin is between 40000 cp and 170000 cp when the layer of the sealing resin is formed. The method also includes placing the sealing substrate on the device substrate so that the layer of the sealing resin is disposed between the sealing substrate and the device substrate, and heating the layer of the sealing resin to harden the sealing resin so that the sealing substrate and the device substrate are attached together by the sealing resin.

8 Claims, 3 Drawing Sheets

DISPLAY DEVICE MANUFACTURING METHOD

BACKGROUND OF THE INVENTION

1. Field of the Invention

The present invention relates to a display device provided with a self-emission element, especially to a display device provided with an electroluminescenct element and a thin film transistor.

2. Description of the Related Art

In recent years, an electroluminescenct (hereafter, referred to as an EL) display device with an EL element has been receiving an attention as a display device substituting for a CRT and an LCD. For example, research and developments are being pursued for the EL display device provided with a thin film transistor (hereafter, referred to as a TFT) as a switching device for driving the EL element.

The above EL display device is formed, for example, by laminating the TFT and an organic EL element sequentially on a transparent glass substrate (hereafter, referred to as an insulating substrate).

A gate electrode is formed on the insulating substrate, and a gate insulating film and an active layer made of a p-Si film are laminated sequentially thereon.

In the active layer, a channel is provided above the gate electrode and source and drain regions are severally provided on both sides of the channel above the gate electrode.

An interlayer insulating film is formed on whole surfaces of the gate insulating film and the active layer, and a drain electrode is formed by filling metal such as Al in a contact hole provided correspondingly to the drain region.

Furthermore, on a whole surface of the interlayer insulating film, there are formed a flattening insulation layer for flattening the surface, which is made of, for example, an organic resin, and a contact hole on a position corresponding to the source region in the flattening insulation layer. On the flattening insulation layer, there is formed an anode of the EL element, which serves as a source electrode made of ITO (Indium Tin Oxide) and contacting to the source region through the contact hole.

A hole transport layer is formed on the anode of ITO and an emission layer is formed thereon. An electron transport layer is formed to cover the emission layer and a cathode is laminated thereon.

Here, there will be described a sealing configuration of a conventional EL display device, referring to the above substrate integrated with the EL element as a device substrate.

First, the device substrate and a sealing substrate made of a glass substrate are attached together with a sealing resin which is made of, for example, an epoxy resin and coated on the sealing substrate by a dispenser. The device substrate and the sealing substrate are attached together by heating and hardening the sealing resin interposed therebetween.

In heating and pressing processes for the adhesion of the device substrate and the sealing substrate, inert gas filling the EL display device expands. At that time, an opening as an escape route for the expanding inert gas must be provided in the sealing resin in order to avoid bursting of the sealing resin. Therefore, this opening is closed after filling the inert gas.

When the opening is closed after the adhesion as described above, however, moisture etc can be mixed in the EL display device to cause deterioration of the EL display device.

Adhesion of the substrates without forming the opening can provide a risk of bursting the sealing resin by a pressure differential between an inside and an outside of the EL display device.

SUMMARY OF THE INVENTION

The invention provides a display device manufacturing method including providing a device substrate having a display element thereon, providing a sealing substrate, and forming a layer of a sealing resin on the sealing substrate. The viscosity of the sealing resin is equal to or higher than 40000 cp when the layer of the sealing resin is formed. The method also includes placing the sealing substrate on the device substrate so that the layer of the sealing resin is disposed between the sealing substrate and the device substrate, and heating the layer of the sealing resin to harden the sealing resin so that the sealing substrate and the device substrate are attached together by the sealing resin. The layer of the sealing resin surrounds the display element after the attaching of the sealing substrate and the device substrate.

The invention provides another display device manufacturing method including providing a device substrate having a display element thereon, providing a sealing substrate, and forming a layer of a sealing resin on the device substrate so that the layer of the sealing resin surrounds the display element. The viscosity of the sealing resin is equal to or higher than 40000 cp when the layer of the sealing resin is formed. The method also includes placing the sealing substrate on the device substrate so that the layer of the sealing resin is disposed between the sealing substrate and the device substrate, and heating the layer of the sealing resin to harden the sealing resin so that the sealing substrate and the device substrate are attached together by the sealing resin.

DETAILED DESCRIPTION OF THE INVENTION

There will be described hereinafter an embodiment of a display device manufacturing method of this invention. In this embodiment, an EL display device is used as an example.

Figure 2:
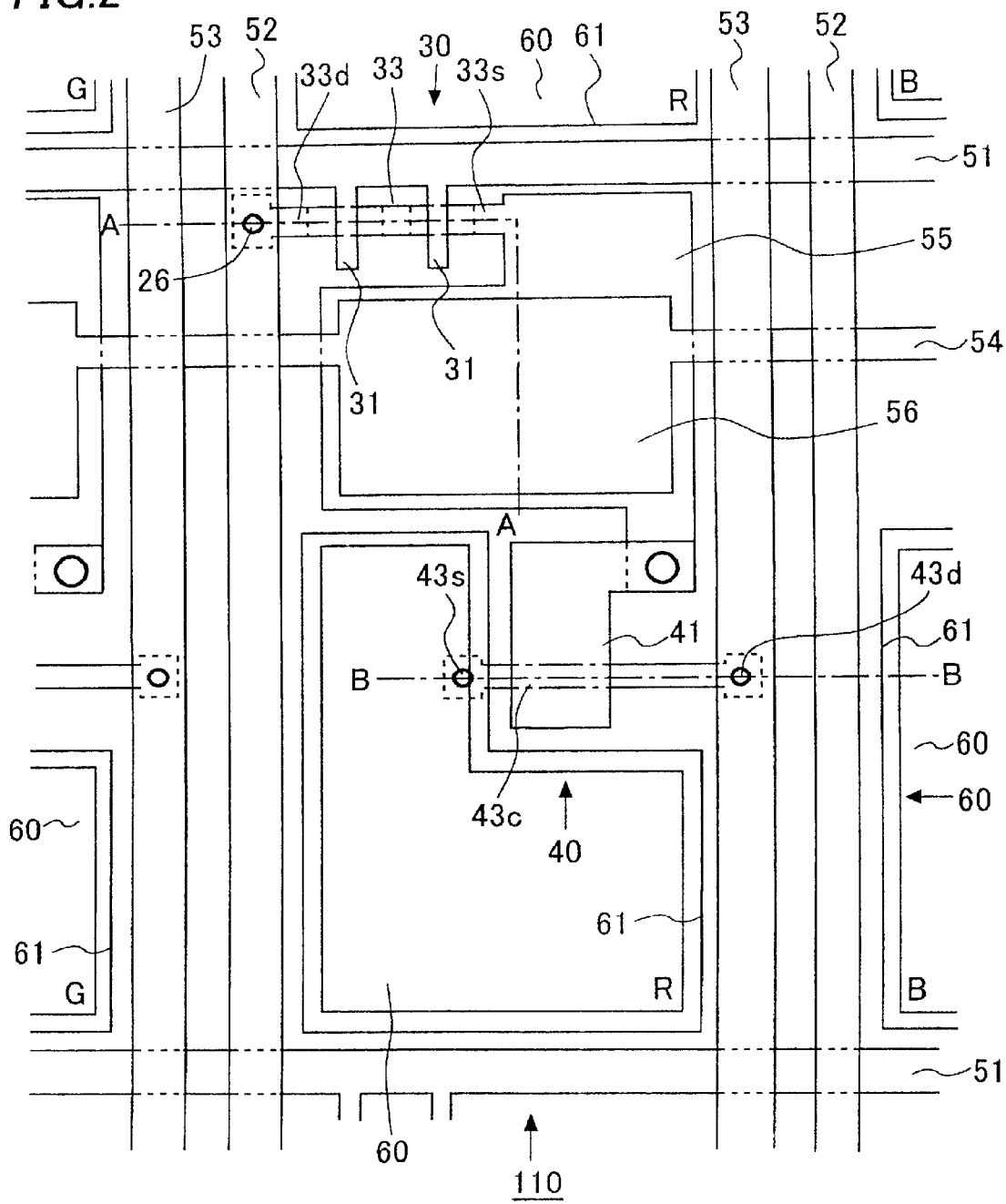
FIG. 2 is a plan view of the EL display device of the embodiment.
Figure 3A:
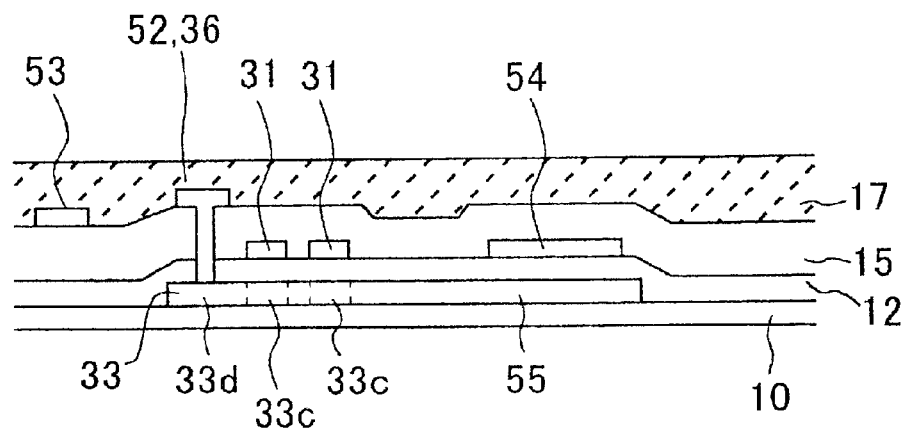
FIGS. 3A and 3B are sectional views of the EL display device of FIG. 2.
Figure 3B:
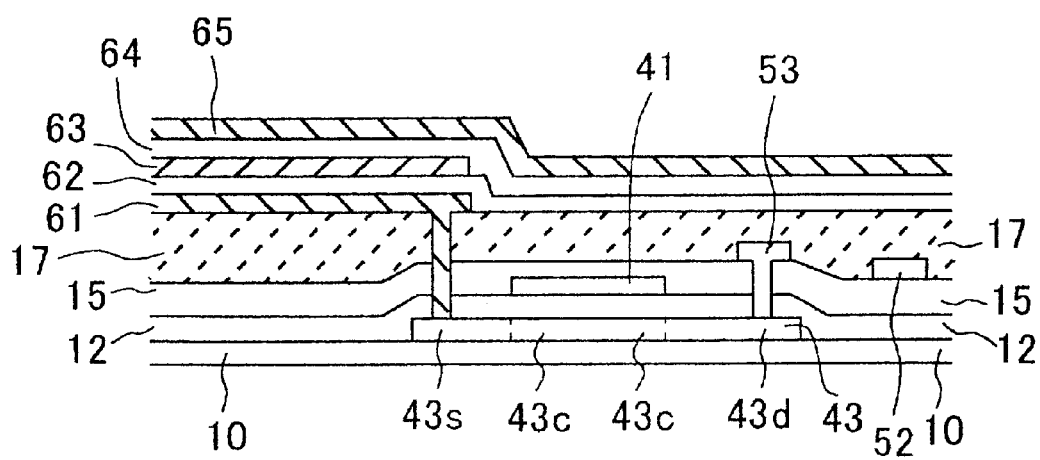

FIG. 2 shows a plan view of a pixel of the organic EL display device of this embodiment. FIG. 3A shows a sectional view along A—A line of FIG. 2 and FIG. 3B shows a sectional view along B—B line of FIG. 2.

As shown in FIG. 2, a pixel 110 is formed in a region enclosed with a gate signal line 51 and a drain signal line 52. The pixels 110 are disposed in a matrix.

There are disposed in the pixel 110 an organic EL element 60 as a self-emission device, a switching TFT 30 for controlling a timing of supplying an electric current to the organic EL element 60, a driving TFT 40 for supplying an electric current to the organic EL element 60 and a storage capacitor. The organic EL element 60 includes an anode 61, an emission layer made of an emission material, and a cathode 65.

The switching TFT 30 is provided in a periphery of an intersection of the both signal lines 51 and 52. A source 33s of the switching TFT 30 serves as a capacitor electrode 55 for forming a capacitor with a storage capacitor electrode line 54 and is connected to a gate electrode 41 of the driving TFT 40. A source 43s of the driving TFT 40 is connected to the anode 61 of the organic EL element 60, while a drain 43d is connected to a driving source line 53 as a current source to be supplied to the organic EL element 60.

The storage capacitor electrode line 54 is disposed in parallel with the gate signal line 51. The storage capacitor electrode line 54 is made of chromium and forms a capacitor by storing an electric charge with the capacitor electrode 55 connected to the source 33s of the TFT through a gate insulating film 12. A storage capacitor 56 is provided for storing voltage applied to the gate electrode 41 of the driving TFT 40.

As shown in FIGS. 3A and 3B, the organic EL display device is formed by laminating the TFTs and the organic EL element sequentially on a substrate 10 such as a substrate made of a glass or a synthetic resin, a conductive substrate, or a semiconductor substrate. When using a conductive substrate or a semiconductor substrate as the substrate 10, however, an insulating film made of an insulating material, such as $SiO_2$ and SiN, is formed on the substrate 10, and then the switching TFT 30, the driving TFT 40 and the organic EL element 60 are formed thereon. Each of the two TFTs has a so-called top gate structure in which a gate electrode is disposed above an active layer with a gate insulating film being interposed therebetween.

There will be described the switching TFT 30 first.

As shown in FIG. 3A, an amorphous silicon film (hereafter, referred to as an a-Si film) is formed on the insulating substrate 10 made of a silica glass or a non-alkali glass by a CVD method. The a-Si film is irradiated by laser beams for melting and recrystalizing to form a poly-silicon film (hereafter, referred to as a p-Si film) as an active layer 33. On the active layer 33, a single-layer or a multi-layer of an $SiO_2$ film and an SiN film is formed as the gate insulating film 12. There are disposed on the gate insulating film 12 the gate signal line 51 made of metal having a high melting point such as Cr and Mo and also serving as a gate electrode 31, the drain signal line 52 made of Al, and the driving source line 53 made of Al and serving as a driving source of the organic EL element.

An interlayer insulating film 15 laminated with an $SiO_2$ film, an SiN film and an $SiO_2$ film sequentially is formed on the whole surfaces of the gate insulating film 12 and the active layer 33. There is provided a drain electrode 36 by filling metal such as Al in a contact hole provided correspondingly to a drain 33d. Furthermore, a flattening insulation film 17 for flattening a surface which is made of organic resin is formed on the whole surface.

Next, there will be described the driving TFT 40 of the organic EL element. As shown in FIG. 3B, an active layer 43 formed by poly-crystalizing an a-Si film by irradiating laser beams thereto, the gate insulating film 12, and the gate electrode 41 made of metal having a high melting point such as Cr and Mo are formed sequentially on the insulating substrate 10 made of a silica glass or a non-alkali glass. There are provided in the active layer 43 a channel 43c, and a source 43s and a drain 43d on both sides of the channel 43c. The interlayer insulating film 15 laminated with an $SiO_2$ film, an SiN film and an $SiO_2$ film sequentially is formed on the whole surfaces of the gate insulating film 12 and the active layer 43. There is disposed the driving source line 53 connected to a driving source by filling metal such as Al in a contact hole provided correspondingly to a drain 43d. Furthermore, a flattening insulation film 17 for flattening a surface, which is made of, for example, an organic resin, is formed on the whole surface. A contact hole is formed in a position corresponding to a source 43s in the flattening insulation film 17. There is formed on the flattening insulation film 17 a transparent electrode made of ITO and contacting to the source 43s through the contact hole, i.e., the anode 61 of the organic EL element. The anode 61 is formed in each of the pixels, being isolated as an island.

The organic EL element 60 has a structure of laminating sequentially the anode 61 made of a transparent electrode such as ITO (Indium Tin Oxide), a first hole transport layer made of MTDATA (4,4-bis(3-methylphenylphenylamino) biphenyl), a hole transport layer 62 made of a second hole transport layer made of TPD (4,4,4-tris(3-methylphenylphenylamino)triphenylanine), an emission layer 63 made of $Bebq_2$ (bis(10-hydroxybenzo[h]quinolinato)beryllium) containing a quinacridone derivative, an electron transport layer 64 made of $Bebq_2$, and a cathode 65 made of magnesium-indium alloy, aluminum or aluminum alloy.

In the organic EL element 60, a hole injected from the anode 61 and an electron injected from the cathode 65 are recombined in the emission layer and an exciton is formed by exciting an organic module forming the emission layer 63. Light is emitted from the emission layer 63 in a process of relaxation of the exciton and then released outside after going through the transparent anode 61 to the transparent insulating substrate 10, thereby to complete light-emission.

Figure 1A:
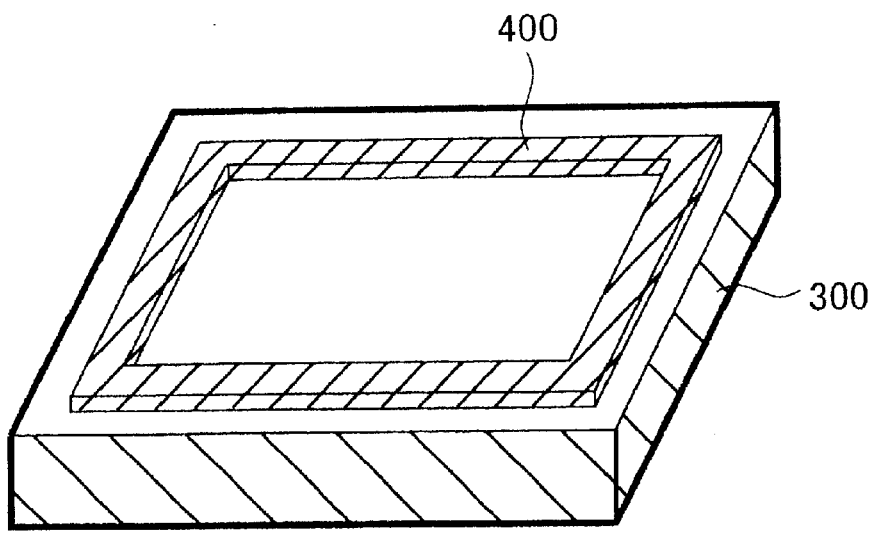
FIGS. 1A and 1B are explanatory views of a sealing structure of an EL display device of an embodiment of this invention.
Figure 1B:
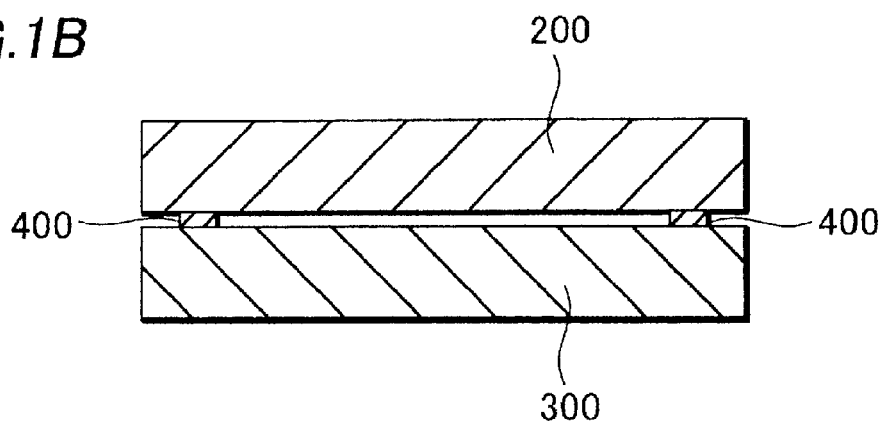

FIGS. 1A and 1B are explanatory views of a sealing configuration of the EL display device of this embodiment. The device substrate 200 integrated with the above EL element 60 and a sealing substrate 300 made of a glass substrate are attached together with a sealing resin 400 which is made of an epoxy resin and coated on the sealing substrate 300 by a dispenser. Inert gas such as $N_2$ gas is sealed in a space between the device substrate 200 and the sealing substrate 300. The device substrate 200 and the sealing substrate 300 are attached together by heating and hardening the sealing resin 400. Thus, the organic EL element 60 is resin-sealed to form the EL display device.

When the sealing substrate 300 is attached to the device substrate 200 using the sealing resin 400 as an adhesive, the viscosity of the sealing resin is 40000 cp or higher. Viscosity of the sealing resin 400 is obtained by measuring viscous friction torque. An object to be measured, i.e., the sealing resin 400, is placed in a container of a measuring instrument. Then the torque induced by rotating an axis immersed in the sealing resin 400 is measured. The viscosity of the sealing resin 400 is then determined based on the relationship between the torque and the viscosity measured in advance.

The problem of the conventional method is that there is a high risk of bursting the sealing resin during the heating for resin hardening if there is in the sealing resin layer no opening as an escape route for inert gas. In this embodiment, however, maintaining the viscosity of the sealing resin at the above range when the resin layer is formed on the sealing substrate enables the resin-sealing without bursting the sealing resin.

By maintaining the viscosity of the sealing resin at a range higher than that of the conventional method, it is possible to provide the resin layer with the strength enough to withstand the pressure difference between the inside and the outside of the sealing structure during the heating. In the embodiment, a range of the viscosity of the sealing resin is between 40000 cp and 170000 cp. A pressing device capable of applying a pressure higher than that used in the conventional method is required to use the sealing resin having the high viscosity in this range. The viscosity cannot be higher than 170000 cp since such a high viscosity makes it difficult to deform the resin layer between the substrates on adhesion (pressing and flattening the sealing resin).

In addition, the viscosity of the sealing resin is preferably between 80000 cp and 150000 cp, and more preferably between 100000 cp and 130000 cp. If the viscosity is too high, it is difficult to deform the resin layer on adhesion. This leads to a non-uniformity of a gap between the substrates. On the other hand, if the viscosity is too low, the sealing resin can not maintain a linear shape. Therefore, the viscosity ranges described above are suitable for sealing the EL display device without creating an escape opening and yet without bursting the sealing resin. Furthermore, the purity of the inert gas is not deteriorated since the inert gas is sealed without providing the opening. In addition, atmospheric gasses including moisture are not permitted into the EL display device through the opening, thereby inhibiting deterioration of the EL display device.

This embodiment is not limited to the EL display device as described, and may be applicable to a variety of display devices such as a liquid crystal display device.

What is claimed is:

1. A display device manufacturing method comprising:
    providing a device substrate having a display element thereon;
    providing a sealing substrate;
    forming a layer of a sealing resin on the sealing substrate, a viscosity of the sealing resin being equal to or higher than 40000 cp when the layer of the sealing resin is formed;
    placing the sealing substrate on the device substrate so that the layer of the sealing resin is disposed between the sealing substrate and the device substrate; and
    heating the layer of the sealing resin to harden the sealing resin so that the sealing substrate and the device substrate are attached together by the sealing resin, wherein the layer of the sealing resin surrounds the display element after the attaching of the sealing substrate and the device substrate.

2. The display device manufacturing method of claim 1, wherein the viscosity of the sealing resin is less than 170000 cp when the layer of the sealing resin is formed.

3. The display device manufacturing method of claim 1, further comprising sealing an inert gas in a space formed by the sealing substrate, the device substrate and the layer of the sealing resin.

4. The display device manufacturing method of claim 2, further comprising sealing an inert gas in a space formed by the sealing substrate, the device substrate and the layer of the sealing resin.

5. A display device manufacturing method comprising:
    providing a device substrate having a display element thereon;
    providing a sealing substrate;
    forming a layer of a sealing resin on the device substrate so that the layer of the sealing resin surrounds the display element, a viscosity of the sealing resin being equal to or higher than 40000 cp when the layer of the sealing resin is formed;
    placing the sealing substrate on the device substrate so that the layer of the sealing resin is disposed between the sealing substrate and the device substrate; and
    heating the layer of the sealing resin to harden the sealing resin so that the sealing substrate and the device substrate are attached together by the sealing resin.

6. The display device manufacturing method of claim 5, wherein the viscosity of the sealing resin is less than 170000 cp when the layer of the sealing resin is formed.

7. The display device manufacturing method of claim 5, further comprising sealing an inert gas in a space formed by the sealing substrate, the device substrate and the layer of the sealing resin.

8. The display device manufacturing method of claim 6, further comprising sealing an inert gas in a space formed by the sealing substrate, the device substrate and the layer of the sealing resin.

* * * * *